(12) United States Patent
Hashizume et al.

(10) Patent No.: US 10,225,931 B2
(45) Date of Patent: Mar. 5, 2019

(54) SUBSTRATE FOR PRINTED CIRCUIT BOARD, PRINTED CIRCUIT BOARD, AND METHOD FOR PRODUCING SUBSTRATE FOR PRINTED CIRCUIT BOARD

(71) Applicants: SUMITOMO ELECTRIC INDUSTRIES, LTD., Osaka-shi, Osaka (JP); SUMITOMO ELECTRIC PRINTED CIRCUITS, INC., Koka-shi, Shiga (JP)

(72) Inventors: Kayo Hashizume, Osaka (JP); Yoshio Oka, Osaka (JP); Takashi Kasuga, Osaka (JP); Jinjoo Park, Koka (JP); Hiroshi Ueda, Koka (JP)

(73) Assignees: SUMITOMO ELECTRIC INDUSTRIES, LTD., Osaka-shi, Osaka (JP); SUMITOMO ELECTRIC PRINTED CIRCUITS, INC., Koka-shi, Shiga (JP)

( * ) Notice: Subject to any disclaimer, the term of this patent is extended or adjusted under 35 U.S.C. 154(b) by 0 days.

(21) Appl. No.: 15/572,506

(22) PCT Filed: Jun. 1, 2016

(86) PCT No.: PCT/JP2016/066260
§ 371 (c)(1),
(2) Date: Nov. 8, 2017

(87) PCT Pub. No.: WO2016/194972
PCT Pub. Date: Dec. 8, 2016

(65) Prior Publication Data
US 2018/0124925 A1 May 3, 2018

(30) Foreign Application Priority Data

Jun. 4, 2015 (JP) .................................. 2015-113906

(51) Int. Cl.
*H05K 1/09* (2006.01)
*H05K 3/20* (2006.01)
(Continued)

(52) U.S. Cl.
CPC ............... *H05K 1/09* (2013.01); *B32B 15/08* (2013.01); *B32B 15/088* (2013.01); *B32B 15/20* (2013.01);
(Continued)

(58) Field of Classification Search
CPC ............ H05K 3/20; H05K 1/09; H05K 1/097
See application file for complete search history.

(56) References Cited

U.S. PATENT DOCUMENTS 4,572,764 A * 2/1986 Fan ..................... H05K 3/0023
156/235

FOREIGN PATENT DOCUMENTS

| JP | 2000-340911 A | 12/2000 |
| JP | 2006-104504 A | 4/2006 |
| JP | 2006-287217 A | 10/2006 |

* cited by examiner

*Primary Examiner* — Jeremy C Norris
(74) *Attorney, Agent, or Firm* — Drinker Biddle & Reath LLP

(57) ABSTRACT

According to an embodiment of the present invention, a substrate for a printed circuit board, the substrate including a resin film and a metal layer deposited on at least one surface of the resin film, includes a modified layer on the surface of the resin film on which the metal layer is deposited, the modified layer having a composition different from another portion, in which the modified layer contains a metal, a metal ion, or a metal compound different from a main metal of the metal layer. The content of a metal element of the metal, the metal ion, or the metal compound (Continued)

on a surface of the modified layer is preferably 0.2 atomic % or more and 10 atomic % or less.

10 Claims, 1 Drawing Sheet

(51) Int. Cl.
  *B32B 15/08*   (2006.01)
  *B32B 15/088*  (2006.01)
  *H05K 3/38*    (2006.01)
  *B32B 15/20*   (2006.01)
  *H05K 3/46*    (2006.01)
(52) U.S. Cl.
  CPC ............... *H05K 1/097* (2013.01); *H05K 3/38* (2013.01); *H05K 3/388* (2013.01); *H05K 3/4644* (2013.01); *B32B 2307/202* (2013.01); *B32B 2457/08* (2013.01); *H05K 2203/0766* (2013.01)

SUBSTRATE FOR PRINTED CIRCUIT BOARD, PRINTED CIRCUIT BOARD, AND METHOD FOR PRODUCING SUBSTRATE FOR PRINTED CIRCUIT BOARD

TECHNICAL FIELD

The present invention relates to a substrate for a printed circuit board, a printed circuit board, and a method for producing a substrate for a printed circuit board.

BACKGROUND ART

Substrates for printed circuit boards are widely used, substrates including metal layers composed of, for example, metals stacked on surfaces of insulating resin films composed of, for example, resins and being configured to provide printed circuit boards by etching metal layers to form conductive patterns.

There is a need for a substrate for a printed circuit board, the substrate having a high peel strength between a resin film and a metal layer such that when a folding force is applied to a printed circuit board formed from the substrate for a printed circuit board, the metal layer is not peeled from the resin film.

A trend toward smaller and higher-performance electronic devices has recently required higher-density printed circuit boards. In high-density printed circuit boards, finer conductive patterns are more liable to be peeled from resin films. Thus, there is a need for a substrate for a printed circuit board, the substrate being capable of providing a fine conductive pattern and having a good adhesion between a metal layer and a resin film as a substrate that meets the requirement for higher density for a printed circuit board.

To address the requirements, a technique is known in which the adhesion between a metal layer and a resin film is increased by forming a thin copper layer using, for example, a sputtering method on a surface of the resin film and then forming a thick copper layer thereon using an electroplating method. However, in the case where a metal layer is directly deposited on a resin film, it is known that main metal atoms of the metal layer diffuse with time in the resin film to decrease the adhesion between the metal layer and the resin film.

A technique is reported in which a thin chromium layer is deposited by sputtering on a surface of copper foil to be bonded to a resin film, and the resulting copper foil is bonded to the resin film by thermocompression bonding (see Japanese Unexamined Patent Application Publication No. 2000-340911). The presence of a thin layer of a metal different from the main metal of a metal layer at the interface between the metal layer and a resin film provides the effect of hindering the migration of the main metal of the metal layer to the resin film to inhibit a decrease in the adhesion between the metal layer and the resin film due to the diffusion of the main metal atoms of the metal layer in the resin film.

CITATION LIST

Patent Literature

PTL 1: Japanese Unexamined Patent Application Publication No. 2000-340911

SUMMARY OF INVENTION

According to an embodiment of the present invention, a substrate for a printed circuit board, the substrate including a resin film and a metal layer deposited on at least one surface of the resin film, includes a modified layer on the surface of the resin film on which the metal layer is deposited, the modified layer having a composition different from another portion, in which the modified layer contains a metal, a metal ion, or a metal compound different from a main metal of the metal layer.

According to another embodiment of the present invention, a method for producing a substrate for a printed circuit board includes the steps of forming a modified layer on a surface of a resin film by using an alkali solution containing a metal ion, the modified layer having a composition different from another portion, rinsing the resin film with water after the modified layer formation step, and depositing a metal different from the metal ion in the alkali solution on the resin film after the rinse step, in which in the rinse step, the metal ion is left in the modified layer.

DESCRIPTION OF EMBODIMENTS

Problem to be Solved by Disclosure

Figure 1:
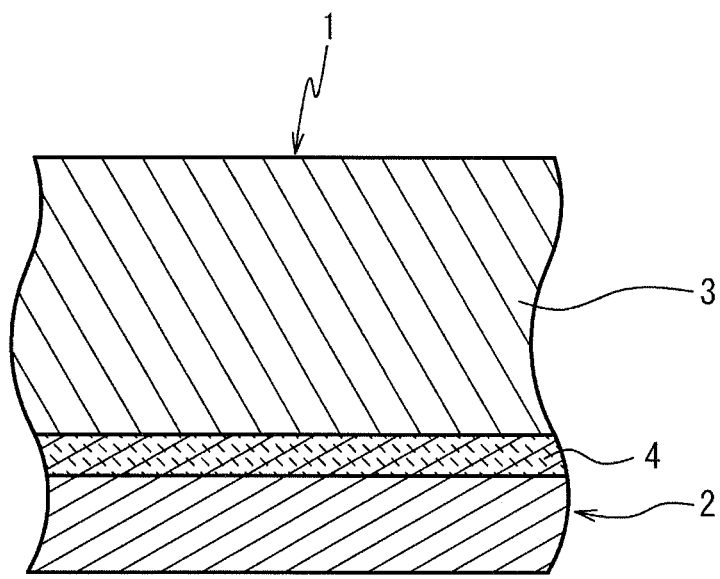
FIG. 1 is a schematic cross-sectional view of a substrate for a printed circuit board according to an embodiment of the present invention.

In the structure described in Japanese Unexamined Patent Application Publication No. 2000-340911, because the thin chromium layer is formed by the sputtering method on the surface of the copper foil, vacuum equipment is needed, thus leading to high costs of, for example, the production, the maintenance, and the operation of the equipment. There is a limit to an increase in the size of the substrate in terms of equipment.

In light of the foregoing circumstances, the present invention aims to provide a relatively inexpensive substrate for a printed circuit board having a good adhesion between a metal layer and a resin film, a printed circuit board, and a method for producing a substrate for a printed circuit board.

Advantageous Effects of Disclosure

A substrate for a printed circuit board according to an embodiment of the present invention and a substrate for a printed circuit board produced by the method for producing a substrate for a printed circuit board are relatively inexpensive and have a good adhesion between a metal layer and a resin film.

DESCRIPTION OF EMBODIMENTS OF INVENTION (1) A substrate for a printed circuit board according to an embodiment of the present invention, the substrate including a resin film and a metal layer deposited on at least one surface of the resin film, includes a modified layer on the surface of the resin film on which the metal layer is deposited, the modified layer having a composition different from another portion, in which the modified layer contains a metal, a metal ion, or a metal compound different from a main metal of the metal layer.

The substrate for a printed circuit board includes the modified layer on the surface of the resin film on which the metal layer is deposited, the modified layer having a composition different from another portion, and thus has an improved adhesion between the metal layer and the resin film at a relatively low cost. The modified layer contains a metal, a metal ion, or a metal compound different from the main metal of the metal layer. The presence of the heterometallic element can inhibit the diffusion of the main metal of the metal layer in the modified layer. Thereby, the substrate for a printed circuit board can maintain a high adhesion between the metal layer and the resin film.

(2) The content of a metal element of the metal, the metal ion, or the metal compound on a surface of the modified layer is preferably 0.2 atomic % or more and 10 atomic % or less. In the case where the content of the metal element of the metal, the metal ion, or the metal compound on the surface of the modified layer is within the range described above, the improved adhesion between the metal layer and the resin film can be more reliably maintained.

(3) The metal of the metal, the metal ion, or the metal compound is preferably an alkali metal or an alkaline-earth metal. In the case where the metal of the metal, the metal ion, or the metal compound is an alkali metal or an alkaline-earth metal, the metal can be relatively easily introduced into the resin film by using an alkali solution containing an ionized metal.

(4) The modified layer on the resin film is preferably formed by alkali treatment of the resin film. In the case where the modified layer on the resin film is formed by alkali treatment of the resin film, both of a modification to improve the adhesion between the metal layer and the resin film and the introduction of a heterometallic element into the resin film to inhibit the diffusion of the main metal of the metal layer in the modified layer can be simultaneously performed.

(5) The main component of the resin film is preferably a polyimide. In the case where the main component of the resin film is a polyimide, the resin film has sufficient insulation and mechanical strength.

(6) The main metal of the metal layer is preferably copper. In the case where the main metal of the metal layer is copper, which is relatively easily dispersed in the resin film, the effect of maintaining the adhesion owing to the introduction of the heterometallic element into the resin film is noticeable.

(7) The metal layer is preferably formed by application and heating of an ink containing metal particles. In the case where the metal layer is formed by application and heating of the ink containing metal particles, the substrate for a printed circuit board is relatively easily produced.

(8) A printed circuit board according to another embodiment of the present invention includes a conductive pattern, in which the conductive pattern is formed from the metal layer of the substrate for a printed circuit board.

Because the printed circuit board is formed from the substrate for a printed circuit board, the printed circuit board is relatively inexpensive, and the conductive pattern formed from the metal layer is not easily peeled from the resin film. The conductive pattern is preferably formed by subjecting the metal layer of the substrate for a printed circuit board to a subtractive method or a semi-additive method.

(9) The content of a metal element different from the main metal on a surface of a modified layer exposed in the conductive pattern is preferably 1.5 atomic % or less. In the case where the content of the metal element different from the main metal on the surface of a modified layer exposed in the conductive pattern is the upper limit or less, a short circuit due to migration does not easily occur.

(10) According to another embodiment of the present invention, a method for producing a substrate for a printed circuit board includes the steps of forming a modified layer on a surface of a resin film by using an alkali solution containing a metal ion, the modified layer having a composition different from another portion, rinsing the resin film with water after the modified layer formation step, and depositing a metal different from a metal ion in the alkali solution on the resin film after the rinse step, in which in the rinse step, the metal ion is left in the modified layer.

In the method for producing a substrate for a printed circuit board, the formation of the modified layer with the alkali solution results in an improved adhesion between the metal layer and the resin film at a relatively low cost. In the method for producing a substrate for a printed circuit board, because the metal ion is left in the modified layer in the rinse step, the presence of the heterometallic element can inhibit the diffusion of the main metal of the metal layer in the modified layer. Thereby, in the method for producing a substrate for a printed circuit board, it is possible to produce a substrate for a printed circuit board having a good adhesion between the metal layer and the resin film at a relatively low cost.

The term "main metal" refers to a metal whose content by mass is largest, the metal content being preferably 50% or more by mass, more preferably 80% or more by mass. The content of an element can be measured by, for example, electron spectroscopy for chemical analysis (ESCA) or X-ray photoelectron spectroscopy (XPS), energy dispersive X-ray spectroscopy (EDX) or energy dispersive X-ray spectroscopy (EDS), electron probe micro analysis (EPMA), time of flight-secondary ion mass spectrometry (TOF-SIMS), secondary ion mass spectrometry (SIMS), or Auger electron spectroscopy (AES). In the case of electron spectroscopy for chemical analysis, measurement can be performed by scanning a surface under the following conditions: the K$\alpha$, radiation of an aluminum metal being used as an X-ray source; a beam diameter of 50 µm; and an X-ray incident angle of 45° with respect to a surface to be analyzed. As a measuring apparatus, for example, a Quantera scanning-type X-ray photoelectron spectroscope available from Ulvac-Phi, Inc. can be used. The content of an element on a surface of the modified layer is defined as the average of measurement values obtained by peeling the metal layer and then measuring the content on a peeled surface of the resin film and a peeled surface of the resin film attached to the metal layer.

DETAILS OF EMBODIMENTS OF INVENTION

A substrate for a printed circuit board according to an embodiment of the present invention will be described in detail below with reference to the drawings.

[Substrate for Printed Circuit Board]

A substrate 1 for a printed circuit board illustrated in FIG. 1 includes a resin film 2 and a metal layer 3 deposited on a surface (metal layer deposition surface) of the resin film 2.

<Resin Film>

The resin film 2 include a modified layer 4 that is located on the metal layer deposition surface and that has a composition different from another portion and an improved adhesion to the metal layer 3.

Examples of a material that can be used for the resin film 2 include flexible resins such as polyimides, liquid crystal polymers, fluororesins, poly(ethylene terephthalate), and poly(ethylene naphthalate); rigid materials such as phenolic cotton paper, cotton paper impregnated with epoxy, glass composites, glass epoxy, polytetrafluoroethylene, and glass-based material; and rigid-flexible materials in which rigid materials and flexible materials are combined together. Among these, a polyimide is particularly preferred because of its high bonding strength to, for example, a metal oxide and its good insulation and mechanical strength.

The thickness of the resin film 2 is not limited and set, depending on a printed circuit board produced from the substrate 1 for a printed circuit board. For example, the lower limit of the average thickness of the resin film 2 is preferably 5 µm, more preferably 12 µm. The upper limit of the average thickness of the resin film 2 is preferably 2 mm, more preferably 1.6 mm. If the average thickness of the resin film 2 is less than the lower limit, the resin film 2 and, by extension, the substrate 1 for a printed circuit board can have insufficient strength. If the average thickness of the resin film 2 is more than the upper limit, the substrate for a printed circuit board can have an unnecessarily large thickness.

(Modified Layer)

The modified layer 4 has a composition different from another portion of the resin film 2 and contains a metal, a metal ion, or a metal compound different from the main metal of the metal layer 3.

The expression "composition different from another portion" of the resin film 2 includes, for example, the case where different contents of elements are obtained by substitution or addition of a functional group to the molecular chain of the resin, the case where a linear molecular chain is cleaved, and the case where a cyclic structure is opened. Although the reason for this is unclear, the structural changes as exemplified above seemingly increase the reactivity of the resin to improve the adhesion to the metal layer 3.

Because the modified layer 4 contains a metal, a metal ion, or a metal compound different from the main metal of the metal layer 3, the metal element (hereinafter, also referred to as a "heterometallic element") functions to inhibit the diffusion of the main metal element of the metal layer 3 in the resin film 2. Thereby, the substrate 1 for a printed circuit board can maintain a high adhesion between the resin film 2 and the metal layer 3.

In the modified layer 4, preferably, the heterometallic element is chemically bonded to a component contained in the resin film 2. In the case where the heterometallic element is chemically bonded to the component contained in the resin film 2, the heterometallic element can be fixed to the resin film to more effectively inhibit the diffusion of the main metal of the metal layer 3 in the resin film 2. The chemical bond between the heterometallic element and the component contained in the resin film 2 can be identified by, for example, electron spectroscopy for chemical analysis (ESCA).

The modified layer 4 is preferably formed by hydrophilization treatment and metal introduction treatment. Examples of the hydrophilization treatment that can be employed include plasma treatment in which a surface is hydrophilized by irradiation of plasma, and alkali treatment in which a surface is hydrophilized by using an alkali solution. Examples of the metal introduction treatment that can be employed include treatment for impregnating the resin film 2 with the heterometallic element by immersing the resin film 2 in a solution containing the heterometallic element, a metal ion thereof, or a metal compound thereof. Among these, the alkali treatment is preferably employed as a method by which the hydrophilization treatment and the metal introduction treatment can be simultaneously performed at a low cost. In the case where the alkali treatment is employed as the hydrophilization treatment and the metal introduction treatment, as described above, the heterometallic element can be relatively easily fixed to the resin film 2 by chemical bonding to more effectively inhibit the diffusion of the main metal of the metal layer 3 in the resin film 2. For example, in the case of the resin film 2 containing a polyimide as a main component, the heterometallic element can be chemically bonded and fixed to a carboxy group formed by ring opening of an imide ring using the alkali treatment.

The modified layer 4 formed by the alkali treatment may contain a component of the alkali solution other than the heterometallic element, for example, a compound containing a hydroxy group originating from the alkali solution. The component of the alkali solution may be present in a state in which the component is bonded to a resin or an additive contained in the resin film 2, and, for example, may be precipitated in the resin film 2 in the form of, for example, a metal hydroxide bonded to the heterometallic element. The component of the alkali solution present in the modified layer 4 can contribute to hydrophilization and the fixation of the heterometallic element to improve the adhesion between the modified layer 4 and the metal layer 3.

As described below, in the case where the metal layer 3 is formed by application and heating of an ink containing metal particles, the formation of the modified layer 4 by the hydrophilization treatment of the resin film 2 results in a low surface tension of the ink on the resin film 2, thereby facilitating the uniform application of the ink to the resin film 2.

The heterometallic element contained in the modified layer 4 is preferably, but not necessarily, a metal that is ionized in an aqueous solution in order to introduce the metal into the modified layer 4 by using an aqueous solution of the metal.

The metal that is ionized in an aqueous solution is preferably, but not necessarily, an alkali metal or an alkaline-earth metal. Among these, sodium, potassium, or calcium, which is inexpensive and easily ionized, is particularly preferred. In other words, when an alkali metal or an alkaline-earth metal is used as the heterometallic element, the heterometallic element can be relatively easily introduced into the modified layer 4 of the resin film 2.

The lower limit of the content of the heterometallic element on a surface of the modified layer 4 is preferably 0.2 atomic %, more preferably 0.5 atomic %, even more preferably 1 atomic %. The upper limit of the content of the heterometallic element on the surface of the modified layer 4 is preferably 10 atomic %, more preferably 9 atomic %, even more preferably 5 atomic %. If the content of the heterometallic element on the surface of the modified layer 4 is less than the lower limit, the diffusion of the main metal of the metal layer 3 in the modified layer 4 can fail to be sufficiently inhibited. If the content of the heterometallic element on the surface of the modified layer 4 is more than the upper limit, the migration of the heterometallic element can easily cause a short circuit when the metal layer 3 is patterned to form a circuit.

<Metal Layer>

Figure 2:
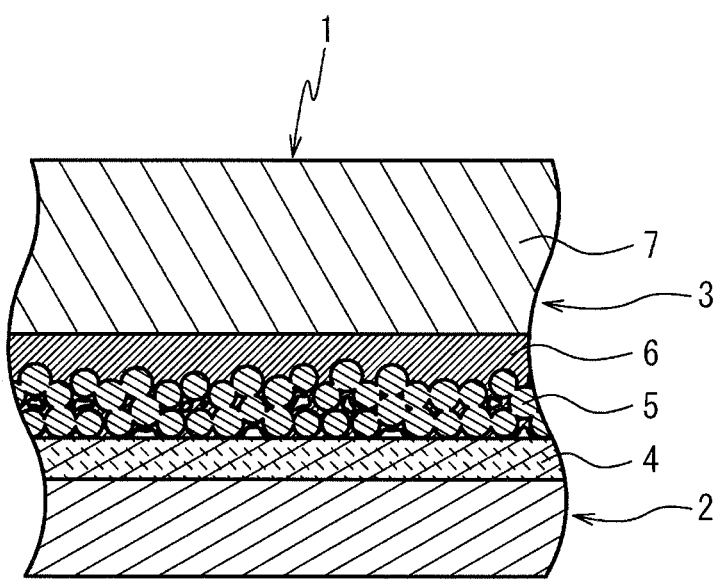
FIG. 2 is a schematic cross-sectional view of a detailed structure of a substrate for a printed circuit board according to an embodiment of the present invention.

The metal layer 3 may have a single-layer structure or a multilayer structure. For example, as illustrated in FIG. 2, the metal layer 3 can have a structure including a first metal layer 5 that is deposited on a surface of the resin film 2 by sintering metal particles, a second metal layer 6 that is deposited on a surface of the first metal layer 5 by electroless plating, and a third metal layer 7 deposited on a surface of the second metal layer 6 by electroplating.

The main metal of the metal layer 3 is preferably a metal such that a metal oxide derived from the metal or a group derived from the metal oxide and a metal hydroxide derived from the metal or a group derived from the metal hydroxide are formed in a portion of the first metal layer 5 in the vicinity of the interface between the first metal layer 5 and the resin film 2. For example, copper (Cu), nickel (Ni), aluminum (Al), gold (Au), or silver (Ag) can be used. Among these, copper is preferably used because copper is a metal that has a high conductivity and a good adhesion to the resin film 2, that is easily patterned by etching, and that is relatively inexpensive. In the case where the main metal of the metal layer 3 is copper, the presence of the heterometallic element in the modified layer 4 significantly provides the effect of inhibiting a decrease in adhesion.

(First Metal Layer)

The first metal layer 5 is formed so as to be deposited on a surface of the resin film 2 by application and heating of an ink on one surface of the modified layer 4, the ink containing metal particles mainly composed of a metal to be used as the main metal of the metal layer 3. The use of the ink containing metal particles can easily and inexpensively form the first metal layer 5 on the one surface of the resin film 2.

The lower limit of the average particle size of the metal particles to be formed into the first metal layer 5 is preferably 1 nm, more preferably 30 nm. The upper limit of the average particle size of the metal particles is preferably 500 nm, more preferably 100 nm. If the average particle size of the metal particles is less than the lower limit, for example, the dispersibility and the stability of the metal particles in the ink are decreased to possibly fail to easily perform uniform deposition on the surface of the resin film 2. If the average particle size of the metal particles is more than the upper limit, gaps between the metal particles are increased, thereby possibly failing to easily reduce the porosity of the first metal layer 5. The term "average particle size" refers to a particle size at 50% cumulative volume of a particle size distribution measured by a laser diffraction method.

The lower limit of the average thickness of the first metal layer 5 formed by application and heating of the ink containing the metal particles is preferably 50 nm, more preferably 100 nm. The upper limit of the average thickness of the first metal layer 5 is preferably 2 μm, more preferably 1.5 μm. If the average thickness of the first metal layer 5 is less than the lower limit, portions where the metal particles are not present in plan view are increased to possibly decrease the conductivity. If the average thickness of the first metal layer 5 is more than the upper limit, it can be difficult to sufficiently reduce the porosity of the first metal layer 5, and the metal layer 3 can have an unnecessarily large thickness.

(Second Metal Layer)

The second metal layer 6 is formed by subjecting the outer surface of the first metal layer 5 to electroless plating to deposit the same metal as the main metal of the first metal layer 5. The second metal layer 6 is also formed so as to be impregnated into the first metal layer 5. In other words, the gaps between the metal particles included in the first metal layer 5 are filled with the main metal by electroless plating to reduce the pores in the first metal layer 5. By filling the gaps between the metal particles with the metal using the electroless plating, the pores between the metal particles are reduced, it is thus possible to inhibit the peeling of the first metal layer 5 from the resin film 2 due to the fact that the pores function as starting points of fracture.

The second metal layer 6 is formed only inside the first metal layer 5, depending on electroless plating conditions, in some cases. In general terms, the lower limit of the average thickness of the second metal layer 6 (excluding the thickness of the plated metal inside the first metal layer 5) formed on the outer surface of the first metal layer 5 is preferably 0.2 more preferably 0.3 μm. The upper limit of the average thickness of the second metal layer 6 formed on the outer surface of the first metal layer 5 is preferably 1 μm, more preferably 0.7 μm. If the average thickness of the second metal layer 6 formed on the outer surface of the first metal layer 5 is less than the lower limit, the gaps between the metal particles of the first metal layer 5 are not sufficiently filled with the second metal layer 6 to fail to sufficiently reduce the porosity, thereby possibly leading to insufficient peel strength between the resin film 2 and the metal layer 3. If the average thickness of the second metal layer 6 formed on the outer surface of the first metal layer 5 is more than the upper limit, the time required to perform electroless plating can be increased to unnecessarily increase the production cost.

(Third Metal Layer)

The third metal layer 7 is formed by subjecting the outer surface side of the first metal layer 5, i.e., the outer surface of the second metal layer 6 to electroplating to further deposit the main metal. The thickness of the metal layer 3 can be easily and accurately adjusted by the third metal layer 7. The use of the electroplating enables the thickness of the metal layer 3 to be increase in a short time.

The thickness of the third metal layer 7 is set, depending on the type and thickness of a conductive pattern required for a printed circuit board formed from the substrate 1 for a printed circuit board, and is not particularly limited. In general, the lower limit of the average thickness of the third metal layer 7 is preferably 1 μm, more preferably 2 μm. The upper limit of the average thickness of the third metal layer 7 is preferably 100 μm, more preferably 50 μm. If the average thickness of the third metal layer 7 is less than the lower limit, the metal layer 3 can be easily damaged. If the average thickness of the third metal layer 7 is more than the upper limit, the substrate 1 for a printed circuit board can have an unnecessarily large thickness, and the substrate 1 for a printed circuit board can have insufficient flexibility.

[Advantage]

The substrate 1 for a printed circuit board includes the modified layer 4 that is located on the metal layer deposition surface of the resin film 2 and that has a composition different from another portion and thus has an improved adhesion between the metal layer 3 and the resin film 2 at a relatively low cost.

Because the modified layer 4 contains the metal, the metal ion, or the metal compound different from the main metal of the metal layer 3, the presence of the heterometallic element can inhibit the dispersion of the main metal of the metal layer 3 in the modified layer 4. Thus, the substrate 1 for a printed circuit board can maintain a high adhesion between the metal layer 3 and the resin film 2.

[Method for Producing Substrate for Printed Circuit Board]

A method for producing the substrate for a printed circuit board includes the steps of forming the modified layer 4 on a surface of the resin film 2 by using an alkali solution containing a metal ion, the modified layer having a composition different from another portion, rinsing the resin film 2 with water after the modified layer formation step, and depositing the metal layer 3 mainly composed of a metal different from the metal ion of the alkali solution on the resin film 2 after the rinse step.

<Modified Layer Formation Step>

In the modified layer formation step, at least one surface of the resin film 2 is brought into contact with the alkali solution by, for example, immersion to form the modified layer 4.

As the alkali solution used in the modified layer formation step, an aqueous alkaline solution containing ions of the heterometallic element to be introduced into the resin film 2 can be used. Examples of the aqueous alkaline solution containing ions of the heterometallic element include aqueous solutions of sodium hydroxide and aqueous solutions of potassium hydroxide.

The alkali solution used in the modified layer formation step can have a pH of, for example, 12 or more and 15 or less. The contact time of the resin film 2 with the alkali solution can be, for example, 15 seconds or more and 10 minutes or less. The alkali solution can have a temperature of, for example, 10° C. or higher and 70° C. or lower.

<Rinse Step>

In the rinse step, although the resin film 2 is rinsed with water to remove the alkali solution adhering to the surface of the resin film 2, the ions of the heterometallic element are left in the modified layer 4. In the rinse step, a component, such as a hydroxide ion, other than the ions of the heterometallic element in the alkali solution is preferably left in the modified layer 4.

In the rinse step, when rinsing is performed by immersion in a water bath, the lower limit of the rinse time is preferably 3 seconds, more preferably 5 seconds. The upper limit of the rinse time is preferably 180 seconds, more preferably 100 seconds, even more preferably 50 seconds. If the rise time is less than the lower limit, the alkali liquid on the surface of the resin film 2 can fail to be sufficiently removed. If the rinse time is more than the upper limit, the heterometallic element can fail to be left in the modified layer 4; thus the effect of inhibiting the diffusion of the main metal of the metal layer 3 in the resin film 2 can be insufficient.

In the case where the surface of the resin film 2 after the rinse step is measured by electron spectroscopy for chemical analysis, the lower limit of the content of the heterometallic element is preferably 1 atomic %, more preferably 2 atomic %. The upper limit of the content of the heterometallic element on the surface of the resin film 2 after the rise step is preferably 10 atomic %, more preferably 9 atomic %. If the content of the heterometallic element on the surface of the resin film 2 after the rise step is less than the lower limit, the heterometallic element diffuses or flows to decrease further in the metal layer deposition step described below, thereby possibly failing to sufficiently inhibiting the diffusion of the main metal of the metal layer 3 in the modified layer 4. If the content of the heterometallic element on the surface of the resin film 2 after the rise step is more than upper limit, the modified layer 4 can have insufficient mechanical strength.

In the rinse step, preferably, the resin film 2 is sufficiently dried after the rinse with water. By evaporating water in the resin film 2, the ions of the heterometallic element are precipitated in the form of a metal or a metal hydroxide or are stabilized by bonding to, for example, a resin component of the resin film 2.

<Metal Layer Deposition Step>

The metal layer deposition step includes the substeps of forming the first metal layer 5 by application and heating of the ink containing the metal particles, forming the second metal layer 6 by electroless plating, and forming the third metal layer 7 by electroplating.

(First Metal Layer Formation Substep)

As the ink used in the first metal layer formation substep, an ink containing a dispersion medium for the metal particles and a dispersant to uniformly disperse the metal particles in the dispersion medium is preferably used. The use of the ink containing the metal particles uniformly dispersed enables the metal particles to be uniformly deposited on the surface of the resin film 2 to uniformly form the first metal layer 5 on the surface of the resin film 2.

The metal particles contained in the ink can be produced by, for example, a high-temperature treatment method, a liquid-phase reduction method, or a gas-phase method. Metal particles produced by the liquid-phase reduction method, by which particles having a uniform particle size can be produced at a relatively low cost, are preferably used.

As the dispersant contained in the ink, a polymer dispersant having a molecular weight of 2,000 or more and 300,000 or less is preferably, but not necessarily, used. The use of the polymer dispersant having a molecular weight within the range enables the metal particles to be satisfactorily dispersed in the dispersion medium, resulting in the dense, defect-free first metal layer 5. If the molecular weight of the dispersant is less than the lower limit, the effect of preventing the aggregation of the metal particles to maintain the dispersion can fail to be sufficiently provided. As a result, the first metal layer 5 deposited on the resin film 2 can fail to be a dense layer having only a few defects. If the molecular weight of the dispersant is more than the upper limit, the dispersant is excessively bulky; hence, the dispersant can hinder the sintering of the metal particles to form voids during heating after the application of the ink. When the dispersant is excessively bulky, the density level of the first metal layer 5 can be decreased, and the decomposition residues of the dispersant can decrease the conductivity.

Preferably, the dispersant does not contain sulfur, phosphorus, boron, a halogen, or an alkali from the viewpoint of preventing the degradation of components. Preferred examples of the dispersant include amine-based polymer dispersants, such as polyethyleneimine and polyvinylpyrrolidone; hydrocarbon-based polymer dispersants each having a carboxylic acid group in its molecule, such as polyacrylic acid and carboxymethyl cellulose; and polymer dispersants each having a polar group, such as Poval (polyvinyl alcohol), styrene-maleic acid copolymers, olefin-maleic acid copolymers, and copolymers each having a polyethyleneimine moiety and a polyethylene oxide moiety in one molecule thereof, all of these dispersants each having a molecular weight within the foregoing range.

The dispersant can be added to the reaction system in the form of a solution in which the dispersant is dissolved in water or a water-soluble organic solvent. The dispersant content is preferably 1 part or more by mass and 60 parts or less by mass per 100 parts by mass of the metal particles. The dispersant surrounds the metal particles to prevent aggregation of the metal particles, thus satisfactorily dispersing the metal particles. If the content of the dispersant is less than the lower limit, the effect of preventing the aggregation can be insufficient. If the content of the dispersant is more than the upper limit, in the heating substep after the application of the ink, an excessive amount of the dispersant can hinder the sintering of the metal particles to form voids, and decomposition residues of the polymer dispersant can be left as impurities in the first metal layer 5 to decrease the conductivity.

The content of water serving as the dispersion medium in the ink is preferably 20 parts or more by mass and 1,900 parts or less by mass per 100 parts by mass of the metal particles. Water serving as the dispersion medium sufficiently swells the dispersant to satisfactorily disperse the metal particles surrounded by the dispersant. If the content of water is less than the lower limit, the effect of water on the swelling of the dispersant can be insufficient. If the content of water is more than the upper limit, the proportion of the metal particles in the ink; thus, the satisfactory first metal layer 5 having a necessary thickness and density can fail to be formed on the surface of the resin film 2.

Regarding an organic solvent optionally mixed with the ink, various water-soluble organic solvents may be used. Specific examples thereof include alcohols such as methyl alcohol, ethyl alcohol, n-propyl alcohol, isopropyl alcohol, n-butyl alcohol, isobutyl alcohol, sec-butyl alcohol, and tert-butyl alcohol; ketones such as acetone and methyl ethyl ketone; esters of a polyhydric alcohol such as ethylene glycol or glycerin or another compound; and glycol ethers such as ethylene glycol monoethyl ether and diethylene glycol monobutyl ether.

The content of the water-soluble organic solvent is preferably 30 parts or more by mass and 900 parts or less by mass per 100 parts by mass of the metal particles. If the content of the water-soluble organic solvent is less than the lower limit, the effect of the organic solvent on the adjustment of the viscosity and the vapor pressure of the dispersion can fail to be sufficiently provided. If the content of the water-soluble organic solvent is more than the upper limit, the effect of swelling the dispersant with water can be insufficient, thus possibly causing the aggregation of the metal particles in the ink.

As a method for applying the ink to the resin film 2, a known coating method, for example, a spin coating method, a spray coating method, a bar coating method, a die coating method, a slit coating method, a roll coating method, or a dip coating method, can be employed. The ink can also be applied to only part of a surface of the resin film 2 by screen printing or with a dispenser or the like.

A coat of the ink formed by the application of the ink to the resin film 2 is heated. Thereby, the solvent and the dispersant in the ink are evaporated or thermally decomposed, and the remaining metal particles are sintered to form the first metal layer 5 on one surface of the resin film 2. The coat of the ink is preferably dried prior to the heating.

The sintering is preferably performed in an atmosphere containing a certain amount of oxygen. The lower limit of the oxygen concentration in the atmosphere during the sintering is preferably 1 ppm by volume, more preferably 10 ppm by volume. The upper limit of the oxygen concentration is preferably 10,000 ppm by volume, more preferably 1,000 ppm by volume. If the oxygen concentration is less than the lower limit, the amount of the metal oxide formed in the portion of the first metal layer 5 in the vicinity of the interface of the first metal layer 5 is small, thus possibly failing to sufficiently improve the adhesion between the resin film 2 and the first metal layer 5. If the oxygen concentration is more than the upper limit, the metal particles can be excessively oxidized to decrease the conductivity of the first metal layer 5.

The lower limit of the sintering temperature is preferably 150° C., more preferably 200° C. The upper limit of the sintering temperature is preferably 500° C., more preferably 400° C. If the sintering temperature is lower than the lower limit, the metal particles cannot be connected together, thus possibly causing the first metal layer 5 to collapse in the next substep of forming the second metal layer 6. If the sintering temperature is higher than the upper limit, the resin film 2 can be deformed.

(Second Metal Layer Formation Substep)

In the second metal layer formation substep, the outer surface of the first metal layer 5 deposited on the one surface of the resin film 2 in the first metal layer formation substep is subjected to electroless plating to form the second metal layer 6.

The electroless plating is preferably performed together with treatment substeps such as a cleaner substep, a rinse substep, an acid treatment substep, a rinse substep, a pre-dip substep, an activator substep, a rinse substep, a reduction substep, and a rinse substep.

After the second metal layer 6 is formed by the electroless plating, preferably, heat treatment is performed. By performing the heat treatment after the formation of the second metal layer 6, the metal oxide or the like in the portion of the first metal layer 5 in the vicinity of the interface between the first metal layer 5 and the resin film 2 is further increased, thereby further increasing the adhesion between the resin film 2 and the first metal layer 5. The temperature and the oxygen concentration during the heat treatment after the electroless plating may be the same as the sintering temperature and the oxygen concentration during the first metal layer formation substep.

(Third Metal Layer Formation Substep)

In the third metal layer formation substep, the third metal layer 7 is deposited by electroplating on the outer surface of the second metal layer 6. The entire thickness of the metal layer 3 is increased to a desired thickness in the third metal layer formation substep.

The electroplating can be performed by using a known electroplating bath corresponding to a plating metal, such as copper, nickel, or silver, under appropriate conditions in such a manner that the metal layer 3 having a desired thickness is rapidly formed without any defect.

[Advantage]

In the method for producing a substrate for a printed circuit board, the modified layer is formed by the alkali treatment on the resin film 2 without using vacuum equipment to improve the adhesion between the metal layer 3 and the resin film 2. It is thus possible to produce the substrate 1 for a printed circuit board at a relatively low cost, the substrate 1 having a good adhesion between the metal layer 3 and the resin film 2.

In the method for producing a substrate for a printed circuit board, the ions of the heterometallic element in the alkali solution is left in the modified layer 4 in the rinse step, thereby inhibiting the diffusion of the main metal of the metal layer 3 in the modified layer 4. According to the method for producing a substrate for a printed circuit board, therefore, it is possible to produce a substrate for a printed circuit board at a relatively low cost, the substrate having a high adhesion between the metal layer 3 and the resin film 2, the adhesion being less likely to decrease.

[Printed Circuit Board]

A printed circuit board is formed from the substrate 1 for a printed circuit board. The printed circuit board is preferably formed from the substrate 1 for a printed circuit board by a subtractive process or a semi-additive process. More specifically, the printed circuit board is produced by forming a conductive pattern using the subtractive process or semi-additive process with the metal layer 3 of the substrate 1 for a printed circuit board.

In the subtractive process, a film of a photosensitive resist is formed on one surface of the substrate 1 for a printed circuit board. The resist is patterned so as to provide a pattern corresponding to a conductive pattern by exposure, development, and other operations. Subsequently, a portion of the metal layer 3 other than the conductive pattern is removed by etching with the patterned resist as a mask. Finally, removal of the remaining resist results in the printed circuit board including the conductive pattern formed of the remaining portion of the metal layer 3 of the substrate 1 for a printed circuit board.

In the semi-additive process, a film of a photosensitive resist is formed on one surface of the substrate 1 for a printed circuit board. The resist is patterned by exposure, development, and other operations to form an opening portion corresponding to a conductive pattern. Subsequently, by plating with the resist as a mask, a conductive layer is selectively deposited using the metal layer 3 exposed in the opening portion of the mask as a seed layer. After the resist is peeled off, a surface of the conductive layer and a portion of the metal layer 3 where the conductive layer is not formed are removed by etching, thereby resulting in the printed circuit board including the conductive pattern in which a conductive layer is further stacked on the remaining portion of the metal layer 3 of the substrate 1 for a printed circuit board.

In the printed circuit board, the upper limit of the content of the heterometallic element different from the main metal of the metal layer 3 on the surface of the modified layer 4 exposed in the conductive pattern is preferably 1.5 atomic %, more preferably 1.0 atomic %, even more preferably 0.5 atomic %. The lower limit of the content of the heterometallic element on the surface of the modified layer 4 exposed in the conductive pattern is not particularly limited. If the content of the heterometallic element on the surface of the modified layer 4 exposed in the conductive pattern is more than the upper limit, a short circuit can be caused by the migration of the metal element when the printed circuit board is used.

[Advantage]

The printed circuit board is produced from the substrate 1 for a printed circuit board and thus has a high adhesion between the resin film 2 and the metal layer 3, so that the conductive pattern is not readily peeled.

When the printed circuit board is formed from the substrate 1 for a printed circuit board by a common subtractive process or semi-additive process, the printed circuit board can be produced at a relatively low cost.

Other Embodiments

The embodiments disclosed herein are to be considered in all respects as illustrative and not limiting. The scope of the invention is defined not by the configurations of the foregoing embodiments but by the following claims, and is intended to include any modifications within the scope and meaning equivalent to the scope of the claims.

The metal layer may be deposited on each surface of the resin film of the substrate for a printed circuit board. In this case, the modified layer may be formed on at least one metal layer deposition surface of the resin film. In this case, the modified layer is preferably formed on each metal layer deposition surface of the resin film.

In the substrate for a printed circuit board, the metal layer may not have a multilayer structure. One or two layers of the first metal layer, the second metal layer, and the third metal layer may be omitted.

In the substrate for a printed circuit board, another overlying metal layer may be provided on the surface of the metal layer. For example, in the foregoing embodiment, the third metal layer may be composed of a metal different from the main metal. In this case, the third metal layer is interpreted as an overlying metal layer. In other words, the main metal of the metal layer refers to the main metal of the metal layer in contact with the resin film.

The first metal layer of the substrate for a printed circuit board may be deposited by a method other than the application and heating of the ink containing the metal particles. Examples of a method for depositing a metal layer without using an ink include thermocompression of metal foil, the deposition of a metal only by electroless plating or electroplating, and the vapor deposition and the sputtering of a metal. For example, in the case where the first metal layer is deposited by sputtering, the lower limit of the thickness of the first metal layer can be 1 nm and the upper limit can be 1,000 nm.

The second metal layer may be deposited by a deposition method other than electroless plating. The third metal layer may be deposited by a deposition method other than electroplating.

EXAMPLES

While the present invention will be described in detail below by examples, the present invention is not interpreted as being limited to the description of the examples.

Prototypes Nos. 1 to 11 of substrates for printed circuit boards were formed on the basis of the following procedures, each of the substrates being formed by forming a modified layer on a surface of a resin film and then depositing a metal layer. With regard to each of the prototypes Nos. 1 to 11 of substrates for printed circuit boards, the content of a metal element (the amount of metal) on a surface of the modified layer before the deposition of the metal layer was measured with ion chromatograph (IC) and by electron spectroscopy for chemical analysis (ESCA). The metal layer of each of the prototypes Nos. 1 to 11 of substrates for printed circuit boards was peeled, and then the content of a metal element (the amount of metal) on a peeled surface was measured by electron spectroscopy for chemical analysis (ESCA). Each of the prototypes Nos. 1 to 11 of substrates for printed circuit boards was subjected to a weathering test, and then the peel strength (as an index of adhesion) of the metal layer was measured before and after the weathering test. The metal layer of each of the prototypes Nos. 1 to 11 of substrates for printed circuit boards was etched to form a stripe-shaped conductive pattern in which a line width and a line gap width were each 50 μm or 100 μm, thereby providing prototypes Nos. 1 to 11 of printed circuit boards. With regard to each of the prototypes Nos. 1 to 11 of printed circuit boards, the content of a metal element (the amount of metal) on a surface of the modified layer exposed in the conductive pattern was measured by electron spectroscopy for chemical analysis (ESCA). Each of the prototypes Nos. 1 to 11 of printed circuit boards was subjected to a migration test in which a voltage was applied over a period of 500 hours.

(Substrate No. 1 for Printed Circuit Board)

As a resin film, a polyimide sheet "Apical NPI" (average thickness: 25 μm, available from Kaneka Corporation) was used. The resin film was immersed in a 2.5 mol/L aqueous solution of sodium hydroxide (pH: about 14) at 40° C. for 90 seconds to form a modified layer. The resin film was then rinsed with water by being immersed in a water bath for 6 seconds, followed by drying. Copper was deposited by sputtering on a surface of the modified layer formed on the resin film to form a second metal layer having an average thickness of 10 nm. Copper was then deposited by electrolytic copper plating to form a third metal layer. Accordingly, a metal layer having an average total thickness of 20 μm was formed, thereby providing a substrate No. 1 for a printed circuit board. In the deposition of copper by sputtering, a vacuum sputtering apparatus was used, and the sputtering was performed under the following sputtering conditions: an ultimate pressure of $0.8 \times 10^{-4}$ Pa, a sputtering pressure of 0.1 Pa, and an electric power of 13 kW.

(Substrate No. 2 for Printed Circuit Board)

As with the substrate No. 1 for a printed circuit board, the same resin film was subjected to the same alkali treatment to form a modified layer. The resin film was then rinsed with water by being immersed in a water bath for 9 seconds, followed by drying. A metal layer was formed on a surface of the modified layer as described below. A copper nanoink (an ink containing 26% by mass of copper particles with a particle size of 80 nm) was applied, dried, and fired at 350° C. for 2 hours in a nitrogen atmosphere to form a first metal layer having an average thickness of 150 nm. Next, copper was deposited by electroless copper plating in such a manner that the average total thickness was 0.5 µm. The resulting copper deposit was fired at 350° C. for 2 hours in a nitrogen atmosphere to form a second metal layer. Subsequently, copper was deposited by electrolytic copper plating to deposit a third metal layer, thus forming a metal layer having an average total thickness of 20 µm. Thereby, a substrate No. 2 for a printed circuit board was provided.

(Substrate No. 3 for Printed Circuit Board)

A substrate No. 3 for a printed circuit board was formed in the same way as the substrate No. 1 for a printed circuit board, except that the rinse time was 9 seconds.

(Substrate No. 4 for Printed Circuit Board)

A substrate No. 4 for a printed circuit board was formed in the same way as the substrate No. 2 for a printed circuit board, except that the rinse time was 30 seconds.

(Substrate No. 5 for Printed Circuit Board)

A substrate No. 5 for a printed circuit board was formed in the same way as the substrate No. 2 for a printed circuit board, except that the rinse time was 60 seconds.

(Substrate No. 6 for Printed Circuit Board)

A substrate No. 6 for a printed circuit board was formed in the same way as the substrate No. 2 for a printed circuit board, except that the rinse time was 150 seconds.

(Substrate No. 7 for Printed Circuit Board)

A substrate No. 7 for a printed circuit board was formed in the same way as the substrate No. 1 for a printed circuit board, except that the rinse time was 150 seconds.

(Substrate No. 8 for Printed Circuit Board)

A substrate No. 8 for a printed circuit board was formed in the same way as the substrate No. 2 for a printed circuit board, except that a 2.5 mol/L aqueous solution of potassium hydroxide was used for the formation of the modified layer.

(Substrate No. 9 for Printed Circuit Board)

A substrate No. 9 for a printed circuit board was formed in the same way as the substrate No. 2 for a printed circuit board, except that a 2.5 mol/L aqueous solution of calcium hydroxide was used for the formation of the modified layer.

(Substrate No. 10 for Printed Circuit Board)

A substrate No. 10 for a printed circuit board was formed in the same way as the substrate No. 1 for a printed circuit board, except that the rinse time was 1 second.

(Substrate No. 11 for Printed Circuit Board)

A substrate No. 11 for a printed circuit board was formed in the same way as the substrate No. 1 for a printed circuit board, except that the rinse time was 300 seconds.

(Ion Chromatograph)

The measurement of the amount of metal on the surface of the modified layer with an ion chromatograph was performed as follows: The rinsed resin film was cut into a piece having a width of 3 cm and a length of 4 cm. The piece was placed in 20 mL of ultrapure water and subjected to extraction at 80° C. for 1 hour to prepare an aqueous solution serving as a sample. The measurement was performed with an ion chromatograph "ICS-3000" available from Thermo Fisher Scientific using an ion separation column "IonPac-CS14" available from. Thermo Fisher Scientific and a suppressor "CERS-500" available from Thermo Fisher Scientific. The measurement was performed under the following measurement conditions: a suppressor current of 30 mA; 10 mmol/L methanesulfonic acid serving as an eluent; an amount of sample injected of 25 µL; and a flow rate of 1.0 mL/min. The measured value was converted into the amount of ions per unit area [µg/cm$^2$] of the resin film.

(Electron Spectroscopy for Chemical Analysis)

The measurement of the amount of metal on the surface of the modified layer by electron spectroscopy for chemical analysis was performed with a Quantera scanning-type X-ray photoelectron spectroscope available from ULVAC-Phi, Inc. under the following conditions: the Kα radiation of an aluminum metal being used as an X-ray source; a beam diameter of 50 µm; and an X-ray incident angle of 45° with respect to a surface to be analyzed.

(Weathering Test)

With regard to the weathering test, the substrates for printed circuit boards were held at 150° C. for 7 days.

(Peel Strength)

The peel strength was measured by a method in conformity with JIS-K-6854-2 (1999) "Adhesives—Determination of peel strength of bonded assemblies—Part 2: 180° peel", provided that the resin film was regarded as a flexible adherend.

(Migration Test)

A voltage of 1 V with respect to a line gap width of 1 µm (the electric field strength between the lines was 1 V/µm) was continuously applied across adjacent lines of the conductive pattern in an atmosphere with a temperature of 85° C. and a humidity of 85%, and then a line-to-line electrical resistance (insulation resistance) was measured after an elapsed time of 500 hours.

Table 1 summarizes the formation conditions of the prototypes of the substrates for printed circuit boards and the printed circuit boards, the measurement results of the amounts of metals, the measurement results of the peel strength, and the measurement results of the insulation resistance in the migration test.

TABLE 1

| | Type of alkali | Alkali treatment time [s] | Rinse time [s] | Method for forming metal layer | Amount of metal after rinse (IC) [μg/cm$^2$] | Amount of metal after rinse (ESCA) [atomic %] | Amount of metal peeled surface (ESCA) [atomic %] | Amount of metal exposed portion (ESCA) [atomic %] | Peel strength before weathering test [N/cm] | Peel strength after weathering test [N/cm] | Line-to-line resistance after migration test [Ω] |
|---|---|---|---|---|---|---|---|---|---|---|---|
| No. 1 | sodium hydroxide | 90 | 6 | copper sputtering | 3.5 | 8.6 | 8.1 | 1.2 | 11.5 | 9.5 | 8.2E+08 |
| No. 2 | sodium hydroxide | 90 | 9 | copper nanoink | 2.8 | 5.2 | 1.2 | 0.3 | 10.8 | 7.4 | 7.8E+10 |
| No. 3 | sodium hydroxide | 90 | 9 | copper sputtering | 2.8 | 5.2 | 4.6 | 0.8 | 9.1 | 7.2 | 1.5E+10 |
| No. 4 | sodium hydroxide | 90 | 30 | copper nanoink | 2.0 | 4.7 | 0.8 | 0.2 | 11.3 | 7.6 | 0.8E+11 |
| No. 5 | sodium hydroxide | 90 | 60 | copper nanoink | 1.6 | 4.2 | 0.6 | 0.1 | 9.2 | 6.6 | 1.4E+11 |
| No. 6 | sodium hydroxide | 90 | 150 | copper nanoink | 0.3 | 1.6 | 0.3 | 0.0 | 8.6 | 4.1 | 3.7E+11 |
| No. 7 | sodium hydroxide | 90 | 150 | copper sputtering | 0.3 | 1.6 | 1.0 | 0.3 | 8.3 | 5.8 | 8.4E+10 |
| No. 8 | potassium hydroxide | 90 | 9 | copper nanoink | 2.5 | 5.0 | 1.0 | 0.2 | 9.8 | 4.1 | 8.9E+10 |
| No. 9 | calcium hydroxide | 90 | 9 | copper nanoink | 2.9 | 5.5 | 1.3 | 0.3 | 9.4 | 4.6 | 7.7E+10 |
| No. 10 | sodium hydroxide | 90 | 1 | copper sputtering | 5.1 | 12.8 | 12.0 | 1.9 | 10.5 | 8.8 | 6.4E+06 |
| No. 11 | sodium hydroxide | 90 | 300 | copper nanoink | 0.0 | 0.0 | 0.0 | 0.0 | 7.0 | 0.5 | 1.1E+11 |

As described above, with regard to the substrates No. 1 to 10, each containing a relatively large amount of metal element on the surface of the modified layer, for printed circuit boards, a relatively high peel strength was obtained, and in particular, a decrease in peel strength after the weathering test with respect to the peel strength before the weathering test was small. A higher content of the metal element on the surface of the modified layer exposed in the conductive pattern of the printed circuit board was liable to lead to a lower insulation resistance due to migration.

REFERENCE SIGNS LIST 1 substrate for printed circuit board
2 resin film
3 metal layer
4 modified layer
5 first metal layer
6 second metal layer
7 third metal layer

The invention claimed is:

1. A substrate for a printed circuit board, the substrate including a resin film and a metal layer deposited on at least one surface of the resin film, the substrate comprising:
   a modified layer on the surface of the resin film on which the metal layer is deposited, the modified layer having a composition different from another portion,
   wherein the modified layer contains a metal, a metal ion, or a metal compound different from a main metal of the metal layer,
   the metal layer has a first metal layer, a second metal layer, and a third metal layer,
   the first metal layer is deposited on a surface of the resin film,
   the first metal layer includes sintered metal particles,
   the second metal layer is deposited on a surface of the first metal layer so as to be impregnated into the first metal layer, and
   the third metal layer is deposited on a surface of the second metal layer.

2. The substrate for a printed circuit board according to claim 1, wherein a content of a metal element of the metal, the metal ion, or the metal compound on a surface of the modified layer is 0.2 atomic % or more and 10 atomic % or less.

3. The substrate for a printed circuit board according to claim 1, wherein the metal of the metal, the metal ion, or the metal compound is an alkali metal or an alkaline-earth metal.

4. The substrate for a printed circuit board according to claim 1, wherein the modified layer on the resin film is formed by alkali treatment of the resin film.

5. The substrate for a printed circuit board according to claim 1, wherein a main component of the resin film is a polyimide.

6. The substrate for a printed circuit board according to claim 1, wherein the main metal of the metal layer is copper.

7. The substrate for a printed circuit board according to claim 1, wherein the metal layer is formed by application and heating of an ink containing metal particles.

8. A printed circuit board comprising a conductive pattern, wherein the conductive pattern is formed from the metal layer of the substrate for a printed circuit board according to claim 1.

9. The printed circuit board according to claim 8, wherein a content of a metal element different from the main metal on a surface of a modified layer exposed in the conductive pattern is 1.5 atomic % or less.

10. A method for producing a substrate for a printed circuit board, comprising the steps of:
   forming a modified layer on a surface of a resin film by using an alkali solution containing a metal ion, the modified layer having a composition different from another portion;
   rinsing the resin film with water after the modified layer formation step; and depositing a metal layer of a metal that is different from the metal ion of the alkali solution on the resin film after the rinse step, wherein in the rinse step, the metal ion is left in the modified layer, and wherein:

the metal layer has a first metal layer, a second metal layer, and a third metal layer, the first metal layer is deposited on a surface of the resin film, the first metal layer includes sintered metal particles, the second metal layer is deposited on a surface of the first metal layer so as to be impregnated into the first metal layer, and the third metal layer is deposited on a surface of the second metal layer.

* * * * *